United States Patent
Suguro (10) Patent No.: US 7,709,361 B2
(45) Date of Patent: May 4, 2010

(54) METHOD FOR MANUFACTURING A SEMICONDUCTOR DEVICE

(75) Inventor: Kyoichi Suguro, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/175,133

(22) Filed: Jul. 17, 2008

(65) Prior Publication Data

US 2009/0023276 A1    Jan. 22, 2009

(30) Foreign Application Priority Data

Jul. 20, 2007   (JP) .............................. 2007-189818

(51) Int. Cl.
    *H01L 21/04*   (2006.01)
(52) U.S. Cl. ........................ 438/510; 438/306; 438/515; 438/307
(58) Field of Classification Search ................ 438/510, 438/515, 306, 305
    See application file for complete search history.

(56) References Cited

U.S. PATENT DOCUMENTS 6,812,106 B1     11/2004  Xiang et al.
2007/0148888 A1*  6/2007  Krull et al. .................. 438/306

OTHER PUBLICATIONS

Ito et al., "Minimization of Pattern Dependence by Optimized Flash Lamp Annealing," Ext. Abs. the 5th International Workshop on Junction Technology (2005), pp. 59-60.

* cited by examiner

Primary Examiner—Matthew Smith
Assistant Examiner—Wilner Jean Baptiste
(74) Attorney, Agent, or Firm—Finnegan, Henderson, Farabow, Garrett & Dunner, L.L.P.

(57) ABSTRACT

A method for manufacturing a semiconductor device includes forming an impurity diffusion layer in a surface of a semiconductor substrate, wherein the forming the impurity diffusion layer comprises irradiating material including $M1_x M2_y$ ($y/x \leq 1.2$, where x is a ratio of M1, y is a ratio of M2, M1 is material which serves as acceptor or donor in the semiconductor device, M2 is material which does not serve as neither donor nor acceptor in the semiconductor device (except semiconductor of the semiconductor substrate)) onto the semiconductor substrate, and heating the semiconductor substrate by light.

15 Claims, 6 Drawing Sheets

METHOD FOR MANUFACTURING A SEMICONDUCTOR DEVICE

CROSS-REFERENCE TO RELATED APPLICATIONS

This application is based upon and claims the benefit of priority from prior Japanese Patent Application No. 2007-189818, filed Jul. 20, 2007, the entire contents of which are incorporated herein by reference.

BACKGROUND OF THE INVENTION

1. Field of the Invention

The present invention relates to a method for manufacturing a semiconductor device including forming an impurity diffusion layer in a surface of a semiconductor substrate.

2. Description of the Related Art

As transistors have been patterned finer in order to improve the performance of LSIs, the gate length has been decreased. To cope with a decrease in gate length, it is necessary to reduce a junction depth (diffusion depth) of a source/drain region. In the case of fine-patterned transistor having a gate length of 30 nm or less, its minimum junction depth is 15 nm or less, so that very shallow source/drain region is required.

According to the reported conventional ion implantation methods, an acceleration energy of 200 to 500 eV/B$^+$ ion has been used to implant B$^+$ or BF$^{2+}$ or an acceleration energy of 1 keV or less has been used to implant As$^+$. By these ion implantation methods, the distribution of dopant such as B or As implanted into a silicon substrate will spread. Accordingly, it is difficult to obtain the source/drain regions having a high concentration dopant distribution in which the depth is 15 nm or less and the lateral diffusion of the dopant from a mask edge to a region directly under the mask is 10 nm or less.

Moreover, point defect such as atomic vacancy or interstitial atom formed in the silicon substrate owing to the ion implantation will accelerate the diffusion of the dopant. Therefore, the source/drain region will spread more due to annealing carried out after the ion implantation for the purpose of activation of the dopant and recovery of crystal defect (damage).

To solve this problem, a method that instantaneously supplies energy necessary for the annealing has been examined. Specifically, an annealing method using a flash lamp filled with rare gas such as xenon, an annealing method using light such as infrared light or visible light, or an annealing method using laser of ultraviolet has been examined.

A flash lamp is capable of emitting light having a pulse width of sub-millimeters at the minimum. Therefore, according to the flash lamp annealing method, it is possible to activate the dopant implanted into the surface of the silicon substrate with almost no change of the dopant distribution (see T. Ito et al., Paper No. S4-3, Ext. Abs. the 5th international Workshop on Junction Technology 2005).

However, the conventional flash lamp annealing method has the following problems.

To sufficiently recover crystal defect (damage) caused by the ion implantation, a large irradiation energy of at least 30 J/cm$^2$ is required. Such a large irradiation energy increases heat stress in the silicon substrate, thus the crystal damage such as slip or dislocation in the silicon substrate is brought about. As a result, a production yield will be lowered.

Here, in order to reduce the irradiation energy, a method is proposed, which includes ion implantation using an element in the IV group element such as Ge for pre-amorphizing the surface of the silicon substrate wherein light absorption factor of the surface of the silicon substrate is increased by the ion implantation.

However, the conventional pre-amorphization method has the following problem.

Due to the annealing performed after the pre-amorphization, crystal defect (damage) caused by the ion implantation using the element in the IV group element such as Ge is tend to remain. Such crystal defect will be a factor of increasing pn junction leakage current or off current of transistor.

On the other hand, in the case of the flash lamp method or the laser annealing method is used, if the crystal defect (damage) caused by the ion implantation is sufficiently recovered, a Si surface layer of a part of device pattern melts, thus the fine pattern of Si and SiO$_2$ is deformed.

BRIEF SUMMARY OF THE INVENTION

According to an aspect of the present invention, there is provided a method for manufacturing a semiconductor device comprising: forming an impurity diffusion layer in a surface of a semiconductor substrate, wherein the forming the impurity diffusion layer comprises irradiating material including M1$_x$M2$_y$ (y/x≦1.2, where x is a ratio of M1, y is a ratio of M2, M1 is material which serves as acceptor or donor in the semiconductor device, M2 is material which does not serve as neither donor nor acceptor in the semiconductor device (except semiconductor of the semiconductor substrate) onto the semiconductor substrate, and heating the semiconductor substrate by light.

DETAILED DESCRIPTION OF THE INVENTION

The following will describe embodiments of the invention with reference to the drawings.

First Embodiment

Figure 1:
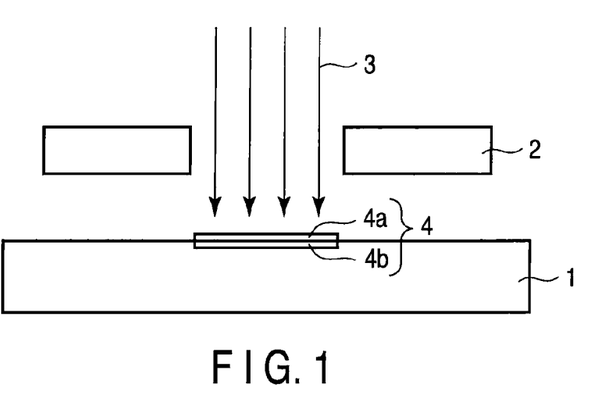
FIG. 1 is a cross-sectional view for explaining a method for manufacturing a semiconductor device in accordance with a first embodiment.
Figure 2:
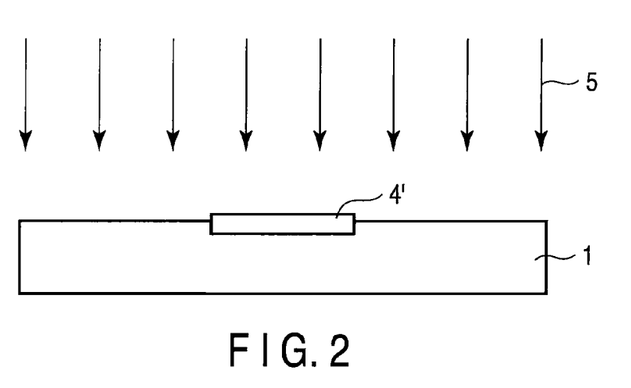
FIG. 2 is a cross-sectional view for explaining the method for manufacturing the semiconductor device in accordance with the first embodiment following FIG. 1.

FIGS. 1 and 2 are cross-sectional views for explaining a method for manufacturing a semiconductor device in accordance with a first embodiment First, as shown in FIG. 1, a stencil mask 2 is disposed above a silicon substrate 1. Impurity 3 is selectively irradiated to a predetermined region of the silicon substrate 1 via the stencil mask 2. As a result, an impurity layer 4 containing the impurity 3 is selectively formed on the predetermined region of the silicon substrate 1.

FIG. 1 shows the impurity layer 4 including an impurity deposited layer 4a formed on the silicon substrate 1 and an impurity doped layer 4b formed in the surface of the silicon substrate 1.

The impurity 3 used in the present embodiment is a material having composition $M1_x M2_y$ (y/x≦1.2), in which M1 indicates a material that serves as an acceptor or a donor in the silicon substrate 1, specifically, B, Ga, In, P, As, or Sb. On the other hand, M2 indicates a material (except for silicon) that does not serves as an acceptor or a donor in the silicon substrate 1, specifically, F or H, for example. Therefore, the present embodiment will not employ impurities such as $B_2H_6$ (y/x=3.0), $B_{10}H_{14}$ (y/x=1.4), and $B_{18}H_{22}$ (y/x=1.22).

The impurity 3 used in the present embodiment may be, for example, $B_{10}H_{10}F_4$ (y/x=1.0), $B_{10}H_{11}F_3$ (y/x=1.1), $B_{10}H_{10}C_4$ (y/x=1.0), $B_{10}H_{11}C_3$ (y/x=1.1), $B_{18}H_{18}F_4$ (y/x=1.0), $B_{18}H_{19}F_3$ (y/x=1.06), $B_{18}H_{20}F_2$ (y/x=1.1), $B_{18}H_{18}C_4$ (y/x=1.0), $B_{18}H_{19}C_3$ (y/x=1.06), $B_{18}H_{20}C_2$ (y/x=1.1), $B_{26}H_{26}F_4$ (y/x=1.0), $B_{26}H_{27}F_3$ (y/x=1.04), $B_{26}H_{28}F_2$ (y/x=1.08), $B_{26}H_{29}F$ (y/x=1.12), $B_{26}H_{26}C_4$ (y/x=1.0), $B_{26}H_{27}C_3$ (y/x=1.04), $B_{26}H_{28}C_2$ (y/x=1.08), $B_{26}H_{29}C$ (y/x=1.12), $B_{34}H_{34}F_4$ (y/x=1.0), $B_{34}H_{35}F_3$ (y/x=1.03), $B_{34}H_{36}F_2$ (y/x=1.06), $B_{34}H_{37}F$ (y/x=1.09), $B_{34}H_{38}$, $B_{34}H_{34}C_4$ (y/x=1.0), $B_{34}H_{35}C_3$ (y/x=1.03), $B_{34}H_{36}C_2$ (y/x=1.06), or $B_{34}H_{37}C$ (y/x=1.09).

By using material having composition $M1_x M2_y$ (y/x≦1.2) as the impurity 3, it is possible to reduce the amount of the material M2 to be introduced into the silicon substrate 1. The material M2 does not serve as neither the acceptor nor the donor in the silicon substrate 1 and will not contribute to the formation of an impurity diffusion layer. Although not contributing to the formation of the impurity diffusion layer, the material M2 in the silicon substrate 1 may possibly have an adverse effect on a fine device and so should preferably be small in amount.

Figure 15:
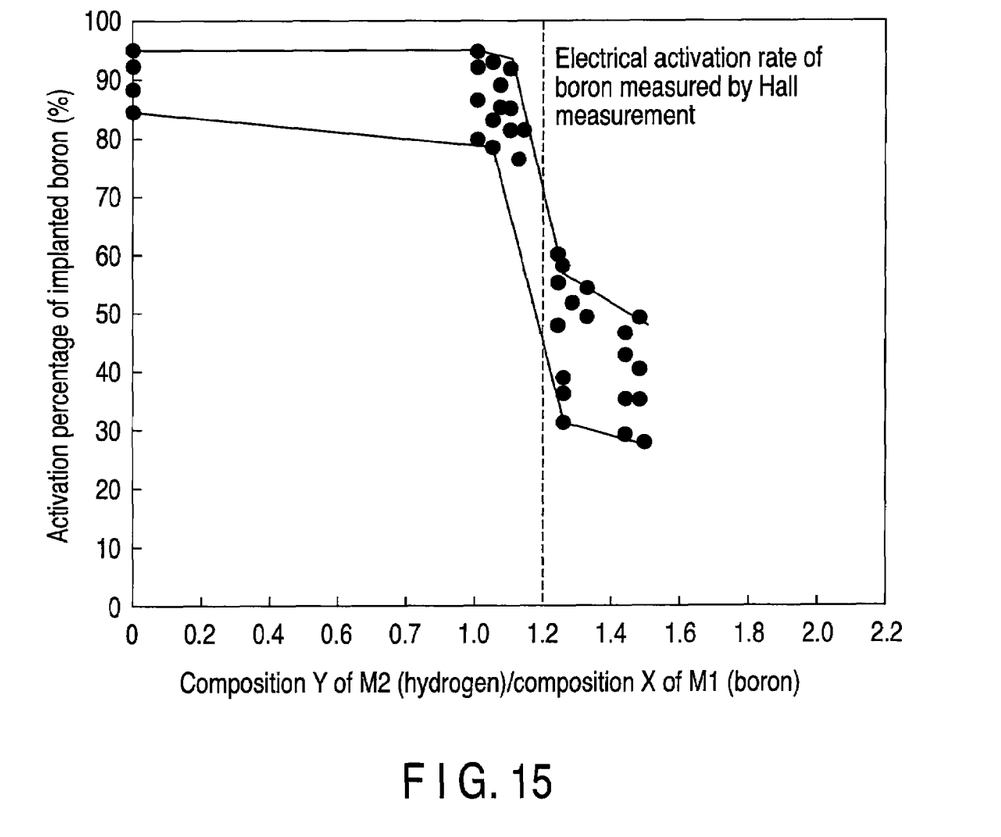
FIG. 15 is a view illustrating relationship between composition ration (y/x) of $M1_x M2_y$ and activation ratio of M2.

FIG. 15 shows a diagram in which y/x is plotted on the horizontal axis (where x is a ratio of M1 (boron), y is a ratio of M2 (hydrogen)) and activation rate of implanted boron is plotted on the vertical axis. The boron implantation is performed such that energy for each boron implanted into the silicon substrate is to be 200 eV, dose amount is to be $1\times10^{15}$ cm$^{-2}$, and incident angle is to be 0 degree. The anneal (heat process) is performed at 1050° C. for one second or less. As may be clear from FIG. 15, if y/x becomes at least 1.2, it is known that the electrical activation rate of boron decreases rapidly. The similar results are found also with other combinations of M1 and M2.

In addition, in the present embodiment, the impurity 3 is exemplified by materials such as $B_{10}H_{10}F_4$, which contains H as M2 and also F in addition to H. In the case of such a type of material, F becomes an evaporable molecule referred to as hydrogen fluoride (HF) and will easily evaporate from the silicon substrate. In addition, in comparison to H, F is tend to aggregate at crystal defects or various interfaces in the silicon substrate and so disperse from an initial implantation position and so has a very small effect on the inactivation of B. Therefore, it is no problem if F is contained. This holds true also with a case where M1 is not B but P, In, or As.

In the above case, B is used as M1, the same effect will be obtained by using other element (at least one element selected from Ga, In, P, As, and Sb). For example, material obtained by replacing B in the material mentioned above with other element mentioned above, for example, $P_{10}H_{10}F_4$ which is obtained by replacing B in $B_{10}H_{10}F_4$ with P, may be used. In addition, M2 is H in the above example, it holds true also with a case where M2 is F.

It is to be noted that silicon does not act as an acceptor or a donor but a material (substrate material) of the silicon substrate 1, so that it is no problem if silicon is introduced into the silicon substrate 1. For the same reason, it is no problem if C, Ge, or Sn, which is of the same group IV type element as silicon, is introduced into the silicon substrate 1 and, further, it is no problem if a plurality of group IV type elements are introduced into the silicon substrate 1. Therefore, the impurity 3 may contain at least one of Si, C, Ge, and Sn. The example of impurity 3 containing such a group IV type element is $B_{10}H_{10}Si_4$, $B_{10}H_{11}Si_3$, $B_{18}H_{18}Si_4$, $B_{18}H_{19}Si_3$, or $B_{18}H_{20}Si_2$.

Further, the impurity 3 is applied to the silicon substrate 1 at a low energy level of 200 eV or less on average per atom. By setting an upper limit of the average energy to 200 eV or less, damage (crystal defect, crystal damage, etc.) which may occur in the silicon substrate is sufficiently suppressed. Thereby, the increasing of pn junction leakage current of transistor is sufficiently suppressed.

Further, by setting the upper limit of the average energy to 200 eV or less, an impurity distribution of the impurity doped layer 4b can be made a box shape. That is, it is possible to obtain an impurity distribution that has a wide high-concentration region.

On the other hand, a lower limit of the above-described average energy should preferably be set to 50 eV or higher. This is because a lower limit of less than 50 eV may cause peel-off of the impurity layer 4.

It is to be noted that another reason why the damage which may occur in the silicon substrate 1 will be suppressed is considered as bellow. The damage occurred in the silicon substrate 1 generally becomes heavier as the number of molecules implanted into the silicon substrate 1 increases. In the present embodiment, as the impurity 3, a material having composition $M1_x M2_y$ (y/x≦1.2) is used, so that more acceptors or donors are obtained for each molecule (per molecule) than the conventional cases. Thereby, less dose amount is required than conventional method to realize the same impurity concentration. Therefore, according to the present embodiment, the number of molecules irradiated onto the silicon substrate 1 is reduced, thus the damage is suppressed.

In addition, in the present embodiment, the impurity 3 includes $M1_xM2_y$ ($y/x \leq 1.2$) which comprises two types of elements, but the impurity 3 may include material includes $M1_xM2_yM3_z$ which comprises three types of elements. Here, M3 is an element having less amount than M2 in the material 3, z ($<y$) is a ration of M3, and M2 and M3 are two selected from H, F and C.

As described above, the impurity layer 4 including the impurity deposited layer 4a and the impurity doped layer 4b is shown in FIG. 1.

Figure 3:
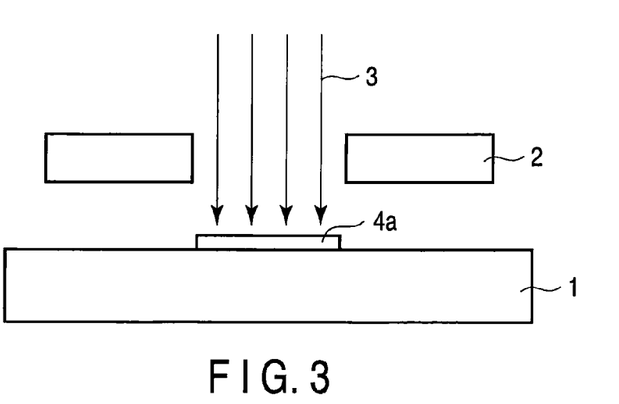
FIG. 3 is a cross-sectional view illustrating a modification of the method for manufacturing the semiconductor device in accordance with the first embodiment.
Figure 4:
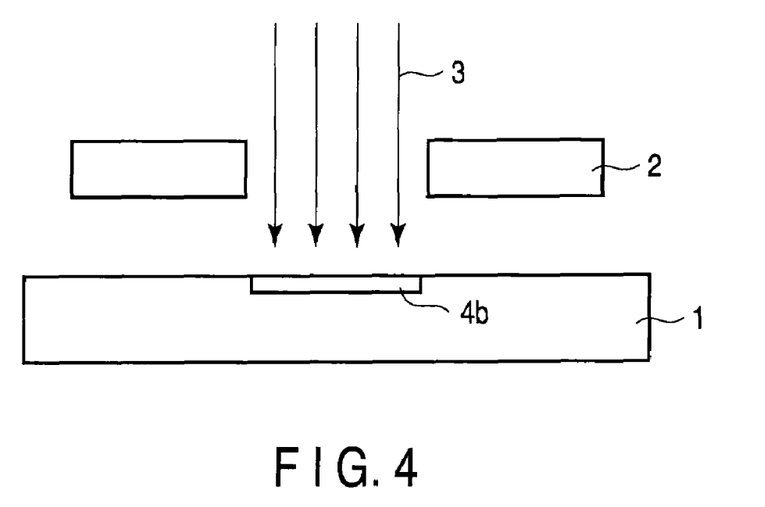
FIG. 4 is a cross-sectional view illustrating another modification of the method for manufacturing the semiconductor device in accordance with the first embodiment.
Figure 5:
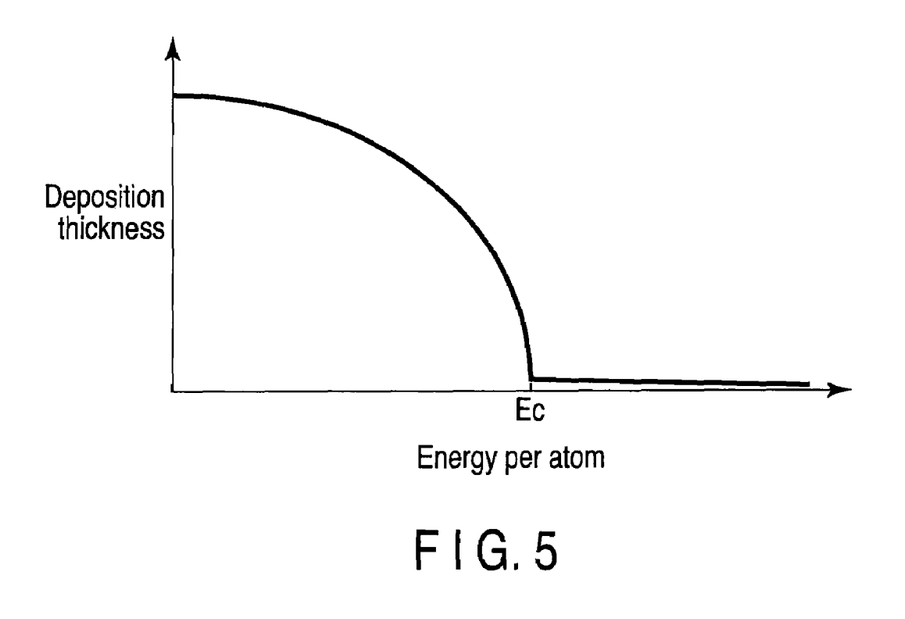
FIG. 5 is a view illustrating relationship between deposition thickness of an impurity deposited layer and average energy per atom of impurities.

However, by controlling the energy per atom of the impurity 3, it is possible to form an impurity layer whose main layer is an impurity deposited layer 4a as shown in FIG. 3 or an impurity layer whose main layer is an impurity doped layer 4b as shown in FIG. 4. This is because if average energy per atom of the impurity 3 exceeds a constant value (Ec), the deposited thickness of the impurity deposited layer 4a is approximately reduced to zero as shown in FIG. 5.

Next, super rapid thermal anneal process is applied on the silicon substrate 1 in order to activate the material M1 in the impurity layer 4.

Specifically, as shown in FIG. 2, the whole of main surface of silicon substrate 1 is irradiated with light 5 containing at least one of ultraviolet light, white light, and infrared light to heat the whole of the silicon substrate 1, then the temperature of the surface of the silicon substrate 1 (substrate temperature) is kept at, for example, 900° C. or higher for a lapse of time of not less than 0.1 millisecond and not more than 100 milliseconds, thereby an impurity diffusion layer 4' is formed.

At this time, not only heating by light 5, but adding heating by another heating apparatus such as a hot plate, the substrate temperature can be easily raised to 900° C. or higher. Further, a lapse of time (heating duration) during which the substrate temperature is kept to 900° C. or higher can be easily controlled by turning ON/OFF the irradiation of light 5.

By setting the heating duration (lapse of time during which the substrate temperature is kept at, for example, 900° C. or higher) at 100 milliseconds or less, the diffusion of the material M1 in the impurity layer 4 is sufficiently suppressed. For example, in the case of B, its diffusion distance will be 3 nm or less. Therefore, according to the present embodiment, the impurity diffusion layer 4' will be realized to be shallow and highly concentrated. Specifically, the impurity diffusion layer 4' is realized to have a steep distribution in which the junction depth (diffusion depth) is 15 nm or less, the lateral diffusion of the dopant is 10 nm or less, and the impurity concentration is in the range of $1 \times 10^{20}$ through $1 \times 10^{21}$ cm$^{-3}$. In addition, as described above, the impurity 3 is irradiated onto the silicon substrate 1 at a low energy level, so that damage (crystal defect, crystal damage, etc.) on the silicon substrate 1 is sufficiently suppressed.

In addition, another reason of realization of the impurity diffusion layer 4' having high impurity concentration is as bellow. That is, the impurity diffusion layer 4' has the box-shaped impurity distribution, and this boxed-shaped impurity distribution is mostly maintained even after the annealing.

Second Embodiment

Figure 6:
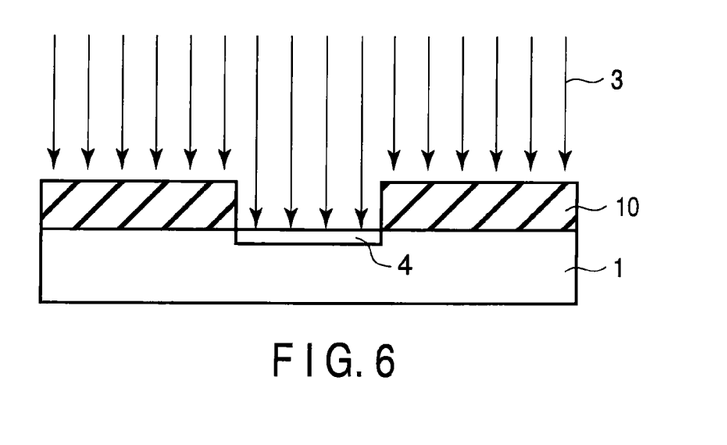
FIG. 6 is a cross-sectional view for explaining a method for manufacturing a semiconductor device in accordance with a second embodiment.

FIG. 6 is a cross-sectional view for explaining a method for manufacturing a semiconductor device in accordance with a second embodiment. In the following figures, the portions corresponding to the portions shown in the previously mentioned drawings are denoted by the same reference numerals and omitted its detail explanation.

The present embodiment is different from the first embodiment in that, as shown in FIG. 6, an impurity layer 4 is formed by irradiating the impurity 3 onto the surface of the silicon substrate 1 through a mask 10 formed on the surface of the silicon substrate 1. At this time, the silicon substrate 1 is preferably heated. The heating temperature is 70° C. or higher, and preferably, 100° C. or higher.

Here, the mask 10 is made of a film that is more heat resistant than a photoresist. Specifically, the mask 10 is made of a carbon film, a silicon nitride film, or a silicon oxide film. By using this kind of film, a heat resistance of 200° C. or higher is secured. Thereby, deterioration (changes in shape and size) of the mask 10 is suppressed even if the mask 10 is heated by striking of impurity 3 on the mask 10 at the time of irradiating the impurity 3. The deterioration of the mask 10 has an influence on the shape and size of the impurity layer 4.

After the formation of the impurity layer 4, the same processes as those of the first embodiments are carried out to form an impurity diffusion layer 4'. The present embodiment also gives the same effects as those by the first embodiment.

Third Embodiment

Figure 7:
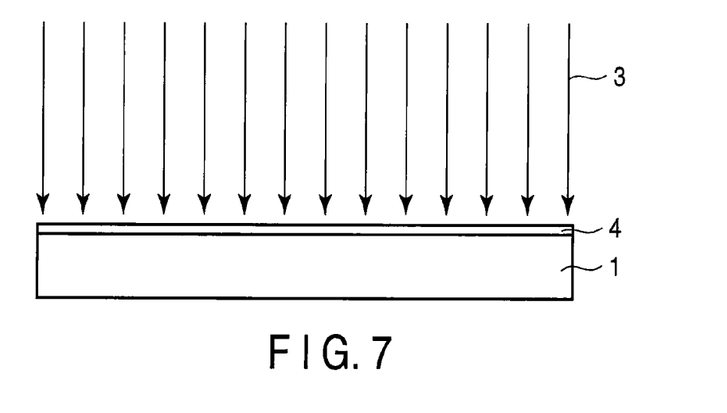
FIG. 7 is a cross-sectional view for explaining a method for manufacturing a semiconductor device in accordance with a third embodiment.
Figure 8:
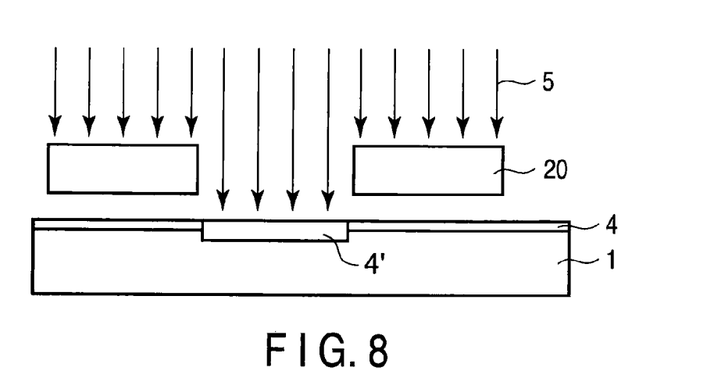
FIG. 8 is a cross-sectional view for explaining the method for manufacturing the semiconductor device in accordance with the third embodiment following FIG. 7.

FIGS. 7 and 8 are cross-sectional views for explaining a method for manufacturing a semiconductor device in accordance with a third embodiment.

First, as shown in FIG. 7, impurity 3 is irradiated onto the silicon substrate 1, thus the impurity layer 4 is formed on the silicon substrate 1. At this time, the silicon substrate 1 is preferably heated. The heating temperature is 70° C. or higher, and preferably, 100° C. or higher.

Conditions for irradiation of the impurity 3 are the same as those in the first embodiment. However, the present embodiment is different from the first embodiment in that the impurity 3 is irradiated onto a region on which the impurity diffusion layer 4' is not to be formed, in addition to the region on which the impurity diffusion layer 4' is to be formed. FIG. 7 shows how the impurity 3 is irradiated on the whole of the main surface of the silicon substrate 1, thus the impurity layer 4 is formed on the whole of the main surface of the silicon substrate 1.

Next, as shown in FIG. 8, a mask 20 is disposed above the silicon substrate 1. The main material of the mask 20 is, for example, silicon. Next, in order to apply super rapid thermal anneal process selectively in a predetermined region of the impurity layer 4, light 5 is selectively irradiated onto the predetermined region of the impurity layer 4 via the mask 20. Thereby the impurity diffusion layer 4' is selectively formed in the predetermined region of the silicon substrate 1. Conditions for the super rapid thermal anneal process are the same as those in the first embodiment.

After the formation of the impurity layer 4, the same processes as those of the first embodiment are carried out to form the impurity diffusion layer 4'. The present embodiment also gives the same effects as those by the first embodiment.

Fourth Embodiment

FIGS. 9 to 14 are cross-sectional views for explaining a method for manufacturing a semiconductor device in accordance with a fourth embodiment. In FIGS. 9 to 14, a left side shows an nMOS formation region (which is indicated as nMOS simply in the figures) and a right side shows a pMOS formation region (which is indicated as pMOS simply in the figures).

Figure 9:
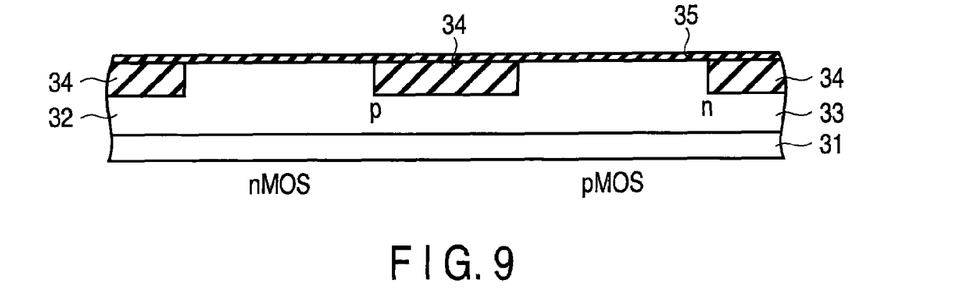
FIG. 9 is a cross-sectional view for explaining a method for manufacturing a semiconductor device in accordance with a fourth embodiment.

[FIG. 9]

A p-well layer 32 is formed in the nMOS formation region and an n-well layer 33 is formed in the pMOS formation region of a p-type silicon substrate 31. By STI process, an isolation region 34 is formed. The isolation region 34 is formed around the active area of n-channel and p-channel MOS transistors which are formed in the nMOS and pMOS formation regions. A gate insulating film 35 is formed on the surface of the p-type silicon substrate 31. The gate insulating film 35 is, for example, a silicon oxide film.

Figure 10:
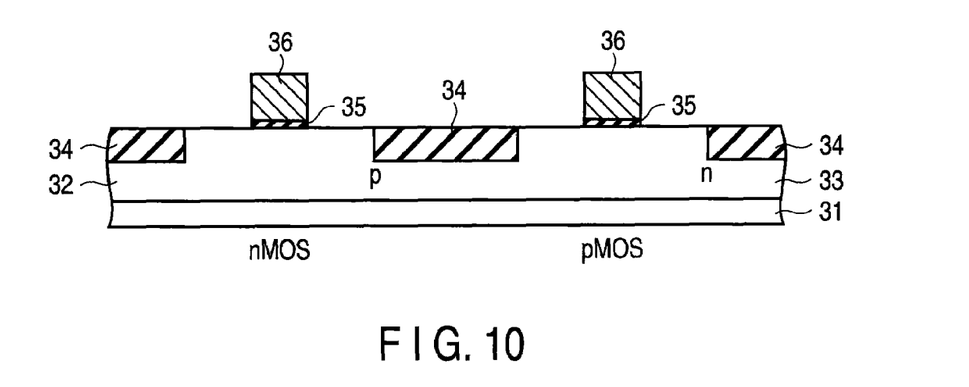
FIG. 10 is a cross-sectional view for explaining the method for manufacturing the semiconductor device in accordance with the fourth embodiment following FIG. 9.

[FIG. 10]

A polycrystalline silicon film to be a gate electrode 36 is formed on the gate insulating film 35, then the polycrystalline silicon film is processed by RIE (Reactive Ion Etching), thus the gate electrode 36 is formed.

Figure 11:
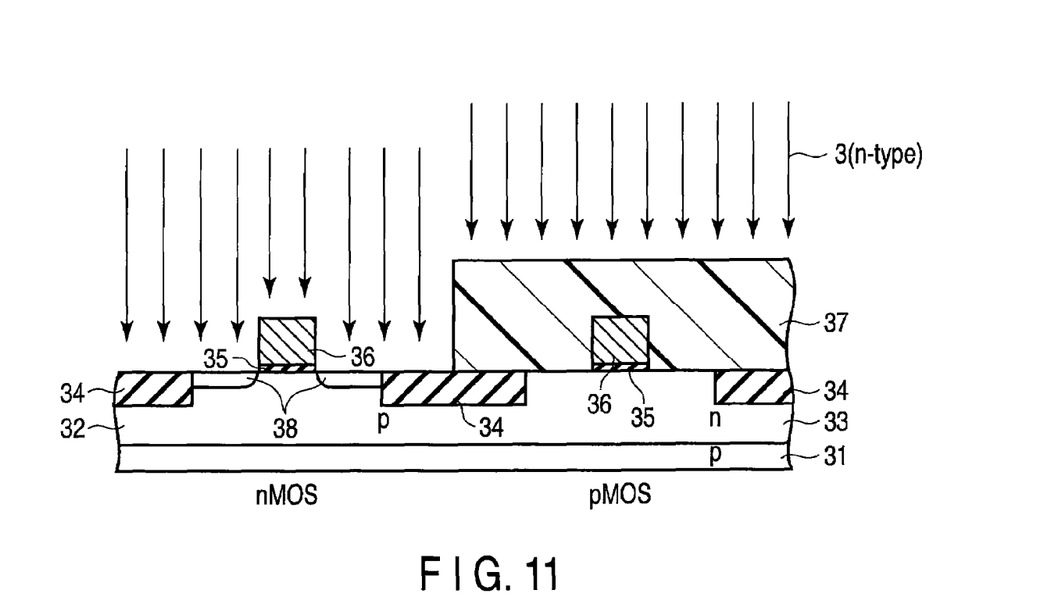
FIG. 11 is a cross-sectional view for explaining the method for manufacturing the semiconductor device in accordance with the fourth embodiment following FIG. 10.

[FIG. 11]

By masking the pMOS formation region with a photoresist film 37 and using the gate electrode 36 in the nMOS formation region as a mask, an (n-type) impurity 3 is irradiated similarly to the first embodiment, thus an impurity layer is formed, thereafter, the anneal process is performed on the impurity layer, thereby an n-type extension 38 contacting the isolation region 34 is formed in the nMOS formation region. Thereafter, the photoresist film 37 is removed.

Here, the impurity 3 (n-type impurity) is, for example, $P_4$. The average energy per atom of the impurity 3 is 100 to 180 eV and dose amount of the impurity 3 is $1 \times 10^{15}$ cm$^{-2}$.

Figure 12:
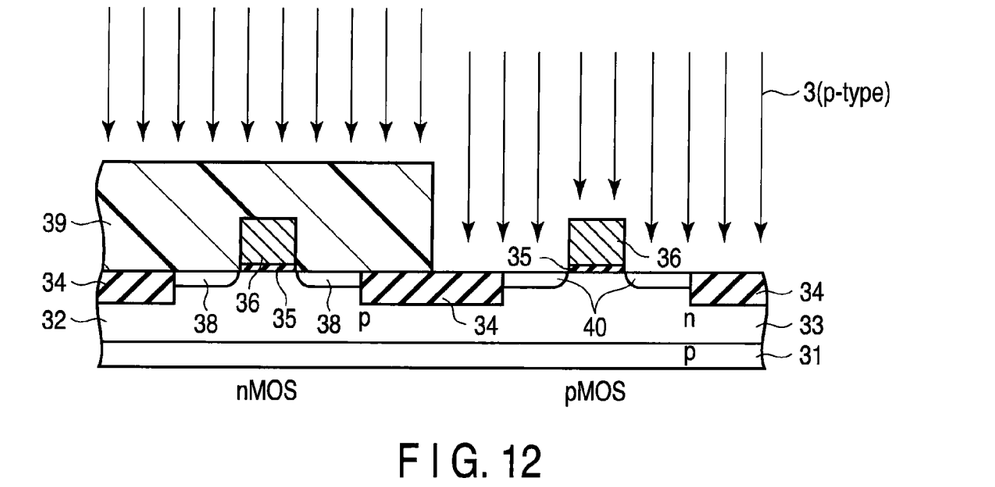
FIG. 12 is a cross-sectional view for explaining the method for manufacturing the semiconductor device in accordance with the fourth embodiment following FIG. 11.

[FIG. 12]

By masking the nMOS formation region with a photoresist film 39 and using the gate electrode 36 in the pMOS formation region as a mask, the (p-type) impurity 3 is irradiated similarly to the first embodiment, thus an impurity layer is formed, thereafter, the anneal process is performed on the impurity layer, thereby a p-type extension 40 contacting the isolation region 34 is formed in the pMOS formation region.

Here, the impurity 3 (p-type impurity) is, for example, $B_{10}H_{10}F_4$ (y/x=1.0), $B_{10}H_{11}F_3$ (y/x=1.1), $B_{10}H_{10}C_4$ (y/x=1.0), $B_{10}H_{11}C_3$ (y/x=1.1), $B_{18}H_{18}F_4$ (y/x=1.0), $B_{18}H_{19}F_3$ (y/x=1.06), $B_{18}H_{20}F_2$ (y/x=1.1), $B_{18}H_{18}C_4$ (y/x=1.0), $B_{18}H_{19}C_3$ (y/x=1.06), $B_{18}H_{20}C_2$ (y/x=1.1), $B_{26}H_{26}F_4$ (y/x=1.0), $B_{26}H_{27}F_3$ (y/x=1.04), $B_{26}H_{28}F_2$ (y/x=1.08), $B_{26}H_{29}F$ (y/x=1.12), $B_{26}H_{26}C_4$ (y/x=1.0), $B_{26}H_{27}C_3$ (y/x=1.04), $B_{26}H_{28}C_2$ (y/x=1.08), $B_{26}H_{29}C$ (y/x=1.12), $B_{34}H_{34}F_4$ (y/x=1.0), $B_{34}H_{35}F_3$ (y/x=1.03), $B_{34}H_{36}F_2$ (y/x=1.06), $B_{34}H_{37}F$ (y/x=1.09), $B_{34}H_{38}$, $B_{34}H_{34}C_4$ (y/x=1.0), $B_{34}H_{35}C_3$ (y/x=1.03), $B_{34}H_{36}C_2$ (y/x=1.06), or $B_{34}H_{37}C$ (y/x=1.09).

The average energy per atom of the impurity 3 is 100 to 180 eV and dose amount of the impurity 3 is $1 \times 10^{15}$ cm$^{-2}$.

Figure 13:
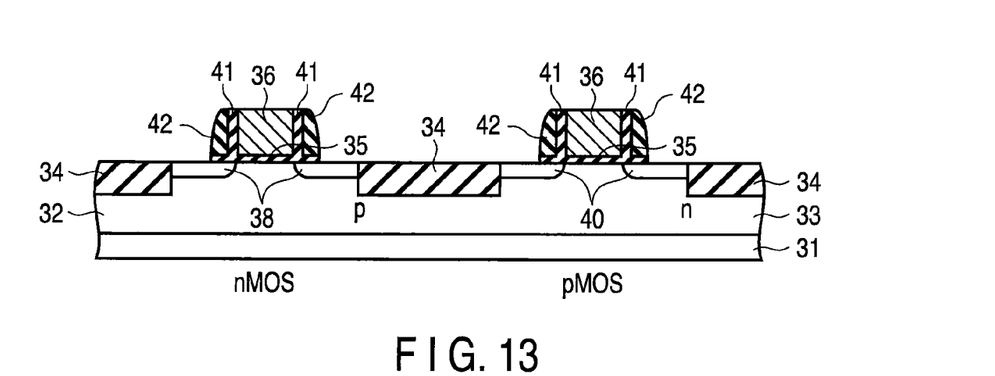
FIG. 13 is a cross-sectional view for explaining the method for manufacturing the semiconductor device in accordance with the fourth embodiment following FIG. 12.

[FIG. 13]

A multilayer-structure side wall spacer including a first side wall spacer 41 and a second side wall spacer 42 is formed on the side wall of the gate electrode 36. This side wall spacer is formed as follows. First, a silicon oxide film to be the first side wall spacer 41, a silicon nitride film to be the second side wall spacer 42 are successively formed by LPCVD (Low Pressure Chemical Vapor Deposition) process on the entire surface. Thereafter, the silicon oxide film and the silicon nitride film are etched by RIE process in a manner that those films are left on the side wall of the gate electrode 36, thereby the first spacer 41 and the second spacer 42 are obtained.

Figure 14:
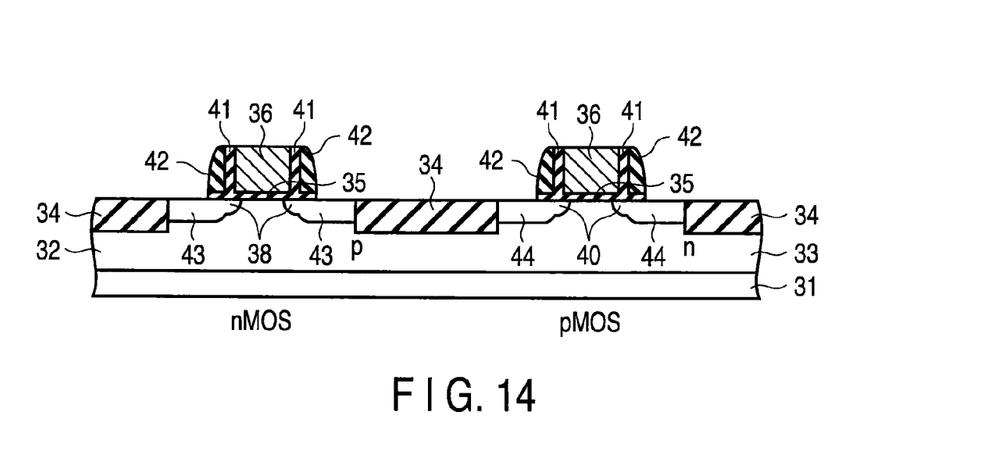
FIG. 14 is a cross-sectional view for explaining the method for manufacturing the semiconductor device in accordance with the fourth embodiment following FIG. 13.

[FIG. 14]

By masking the pMOS formation region with a photoresist film (not shown), and using the gate electrode 36 and the side wall spacers 41 and 42 as a mask, n-type impurity (group V type atom), for example, P is implanted into the nMOS formation region by using ion implantation process, thereafter the implanted n-type impurity is activated by anneal, thereby n-type source/drain regions 43 that are separated from the edge portions of the gate electrode 36 and in contact with the isolation region 34 and the n-type extensions 38. Conditions for the ion implantation of the n-type impurity are, for example, acceleration energy of 10 keV and dose amount of $5 \times 10^{15}$ cm$^{-2}$. It is to be noted that the n-type impurity is also implanted into the gate electrode 36 in the nMOS formation region.

Similarly, by masking the nMOS formation region with a photoresist film (not shown), and using the gate electrode 36 and the side wall spacers 41 and 42 as a mask, a p-type impurity (group III type atom), for example, B is implanted into the pMOS formation region by using the ion implantation process, thereafter the implanted p-type impurity is activated by anneal, thereby p-type source/drain regions 44 that are separated from the edge portions of the gate electrode 36 and in contact with the isolation region 34 and the p-type extensions 40. Conditions for the ion implantation of the p-type impurity are, for example, acceleration energy of 4 keV and dose amount of $5 \times 10^{15}$ cm$^{-2}$. It is to be noted that the p-type impurity is also implanted into the gate electrode 36 in the pMOS formation region.

Here, the n-type impurity and the p-type impurity are respectively activated in the different steps, but the n-type impurity may be activated in the step of activating the p-type impurity at the same time. The n-type and p-type impurities are activated using, for example, a flash lamp, infrared laser, visible laser, or ultraviolet laser.

Although the subsequent processes are not shown, a CMOSFET is completed through known steps including a step of forming an inter-layer insulating film (e.g., silicon oxide film), a step of forming a contact hole in the inter-layer insulating film, and a step of forming an interconnection that connects to the gate electrode 36 and the source/drain regions 43 and 44 via the contact hole.

Evaluation of the electrical characteristics of the CMOSFET manufactured by the method of the present embodiment has come up with good results of a pn junction leakage current of $1 \times 10^{-7}$ A/cm$^2$ at a supply voltage of 0.5 to 2.0V.

It is to be noted that the present invention is not limited to the above embodiments.

For example, although the above embodiments have been described in the case of using the silicon substrate as the semiconductor substrate, an SOI substrate may be used. Further, the present invention is applicable also to a semiconductor substrate containing a material other than silicon, for example, SiGe.

In addition, the impurity is irradiated onto the substrate surface via the stencil mask in the above-described embodiments, but the impurity may be irradiated onto the substrate surface via an opening of a shutter.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for manufacturing a semiconductor device, comprising:
  forming an impurity diffusion layer in a surface of a semiconductor substrate, wherein forming the impurity diffusion layer comprises irradiating material including $M1_x M2_y$ (y/x≦1.2, where x is a ratio of M1, y is a ratio of M2, M1 is a material which serves as an acceptor or a donor in the semiconductor device, M2 is a material which does not serve as a donor or an acceptor in the semiconductor device (except semiconductor of the semiconductor substrate)) onto the semiconductor substrate; and heating the semiconductor substrate by light, wherein the irradiating the material including $M1_x M2_y$ onto the semiconductor substrate comprises selectively irradiating the material including the $M1_x M2_y$ onto a predetermined area of the semiconductor substrate via a stencil mask or an opening of a shutter disposed above the semiconductor substrate.

2. The method according to claim 1, wherein the irradiating the material including the $M1_x M2_y$ onto the semiconductor substrate comprises irradiating material including the $M1_x M2_y$ having energy not higher than 200 eV onto the semiconductor substrate, and the heating the semiconductor substrate by the light is performed such that heating time of the semiconductor substrate is not longer than 100 millisecond.

3. The method according to claim 2, wherein the M1 is one selected from B, Ga, In, P, As and Sb, and the M2 is at least one of H and F.

4. The method according to claim 2, wherein the material further includes M3, the material is expressed by $M1_x M2_y M3_z$ (where M3 is an element having less amount than M2 in the material, z is a ratio of M3, y>z), and M2 and M3 are two selected from H, F and C.

5. The method according to claim 1, wherein the M1 is one selected from B, Ga, In, P, As and Sb, and the M2 is at least one of H and F.

6. The method according to claim 5, wherein the material further includes M3, the material is expressed by $M1_x M2_y M_z$ (where M3 is an element having less amount than M2 in the material, z is a ratio of M3, y>z), and M2 and M3 are two selected from H, F and C.

7. The method according to claim 1, wherein the material further includes M3, the material is expressed by $M1_x M2_y M3_z$ (where M3 is an element having less amount than M2 in the material, z is a ratio of M3, y>z), and M2 and M3 are two selected from H, F and C.

8. The method according to claim 1, wherein the heating the semiconductor substrate by the light is performed such that whole of the semiconductor substrate is heated.

9. A method for manufacturing a semiconductor device, comprising:

forming an impurity diffusion layer in a surface of a semiconductor substrate, wherein forming the impurity diffusion layer comprises irradiating material including $M1_x M2_y$ (y/x≦1.2, where x is a ratio of M1, y is a ratio of M2, M1 is a material which serves as an acceptor or a donor in the semiconductor device, M2 is a material which does not serve as a donor or an acceptor in the semiconductor device (except semiconductor of the semiconductor substrate)) onto the semiconductor substrate; and heating the semiconductor substrate by light, wherein the irradiating the material including the $M1_x M2_y$ onto the semiconductor substrate comprises irradiating the material including the $M1_x M2_y$ onto first and second areas of the semiconductor substrate, wherein the impurity diffusion layer is formed in the first area and the impurity diffusion layer is not formed in the second area, and wherein the heating the semiconductor substrate by the light is performed such that the first area is selectively heated.

10. The method according to claim 9, wherein the irradiating the material including the $M1_x M2_y$ onto the semiconductor substrate comprises irradiating material including the $M1_x M2_y$ having energy not higher than 200 eV onto the semiconductor substrate, and the heating the semiconductor substrate by the light is performed such that heating time of the semiconductor substrate is not longer than 100 millisecond.

11. The method according to claim 10, wherein the M1 is one selected from B, Ga, In, P, As and Sb, and the M2 is at least one of H and F.

12. The method according to claim 10, wherein the material further includes M3, the material is expressed by $M1_x M2_y M3_z$ (where M3 is an element having less amount than M2 in the material, z is a ratio of M3, y>z), and M2 and M3 are two selected from H, F and C.

13. The method according to claim 9, wherein the M1 is one selected from B, Ga, In, P, As and Sb, and the M2 is at least one of H and F.

14. The method according to claim 9, wherein the material further includes M3, the material is expressed by $M1_x M2_y M3_z$ (where M3 is an element having less amount than M2 in the material, z is a ratio of M3, y>z), and M2 and M3 are two selected from H, F and C.

15. A method for manufacturing a semiconductor device, comprising:

forming an impurity diffusion layer in a surface of a semiconductor substrate, wherein forming the impurity diffusion layer comprises irradiating material including $M1_x M2_y M3_z$ (y/x≦1.2, where x is a ratio of M1, y is a ratio of M2, M1 is a material which serves as an acceptor or a donor in the semiconductor device, M3 is an element having less amount than M2 in the material, z is a ratio of M3, y>z, and M2 and M3 are two selected from H, F and C) onto the semiconductor substrate; and heating the semiconductor substrate by light.

* * * * *

UNITED STATES PATENT AND TRADEMARK OFFICE
CERTIFICATE OF CORRECTION

PATENT NO. : 7,709,361 B2  Page 1 of 1
APPLICATION NO. : 12/175133
DATED : May 4, 2010
INVENTOR(S) : Suguro It is certified that error appears in the above-identified patent and that said Letters Patent is hereby corrected as shown below:

*Claim 1, column 9, line 8, change "including $M1_x\ M2_y$" to --including the $M1_x\ M2_y$--.

Claim 2, column 9, line 20, change "100 millisecond." to --100 milliseconds.--.

*Claim 6, column 9, line 33, change "$M1_x\ M2_y\ M_z$" to --$M1_x\ M2_y\ M3_z$--.

Claim 10, lines 21-22, change "100 millisecond." to --100 milliseconds.--.

Signed and Sealed this

Sixth Day of July, 2010

David J. Kappos
*Director of the United States Patent and Trademark Office*

UNITED STATES PATENT AND TRADEMARK OFFICE
CERTIFICATE OF CORRECTION

PATENT NO. : 7,709,361 B2  Page 1 of 1
APPLICATION NO. : 12/175133
DATED : May 4, 2010
INVENTOR(S) : Suguro It is certified that error appears in the above-identified patent and that said Letters Patent is hereby corrected as shown below:

\*Claim 1, column 9, line 8, change "including $M1_x M2_y$" to --including the $M1_x M2_y$--.

Claim 2, column 9, line 20, change "100 millisecond." to --100 milliseconds.--.

\*Claim 6, column 9, line 33, change "$M1_x M2_y M_z$" to --$M1_x M2_y M3_z$--.

Claim 10, column 10, lines 21-22, change "100 millisecond." to --100 milliseconds.--.

This certificate supersedes the Certificate of Correction issued July 6, 2010.

Signed and Sealed this

Third Day of August, 2010

David J. Kappos
*Director of the United States Patent and Trademark Office*